STABLE OPERATING TRANSISTOR AMPLIFIER

Filed May 23, 1960

Inventor
Alan J. Finnamore
By Cushman, Darby & Cushman
Attorney

United States Patent Office 3,029,394
Patented Apr. 10, 1962

3,029,394

STABLE OPERATING TRANSISTOR AMPLIFIER

Alan John Finnamore, Cogenhoe, England, assignor to National Research Development Corporation, London, England, a British corporation Filed May 23, 1960, Ser. No. 30,833
12 Claims. (Cl. 330—3)

This invention is a transistor amplifier intended primarily for the amplification of direct current, although it is also capable of amplifying alternating currents from very low frequencies up to a frequency determined by the characteristics of the transistor and associated circuitry.

The main problem in the design of direct current amplifiers is to minimise the drift (random changes in parameters) introduced by the amplifier, since this sets a limit to the useful sensitivity of the amplifier. This is because the output resulting from a signal comparable in magnitude with drift can not be distinguished with certainty from that resulting from drift.

Drift in transistor amplifiers may be caused by variations with temperature of the interelectrode potentials and currents in the transistors, and to prevent these effects being cumulative over a number of stages in cascade it is necessary to convert the direct current input signal into alternating current by modulation.

The modulation commonly involves the generation of a pulse waveform which is applied to some non-linear device, such as an electromechanical relay or non-linear resistance in series or parallel with the signal to be amplified. An amplifier is then required for the alternating current output from the modulator, and finally the alternating current output is demodulated to obtain an amplified copy of the input.

The transistor amplifier described below utilises modulation of the input signal, but avoids the need for separate switching waveform generator, modulator and amplifier, in such a way that drift can not occur, except as a second order effect, due to the random variations in transistor parameters (or battery supply) with temperature.

The main object of the invention, therefore, is to provide a transistor amplifier capable of stable operation down to zero frequency (direct current) in which a single transistor acts at the same time as both oscillator and modulator of an input signal.

The invention comprises an amplifier for stable operation down to zero frequency and incorporating a transistor having its operating currents fed to it through tightly coupled feedback windings to constitute a free-running blocking oscillator, said windings being on a magnetic transductor core or cores magnetised towards saturation by the blocking oscillator current pulses, input signal windings on said transductor and arranged so that an input signal produces control current flux which aids the magnetic flux of the oscillator current in one part of the transductor core but apposes it in another part of the core, and a pick-off system responsive to the flux changes so produced. Preferably there is a pick-off coil on said one part of the core and a rectifier fed from said pick-off coil, another pick-off coil on said other part of the core and feeding a separate rectifier and the two rectified currents are then opposed to give their difference as the output from the amplifier.

Figure 1:
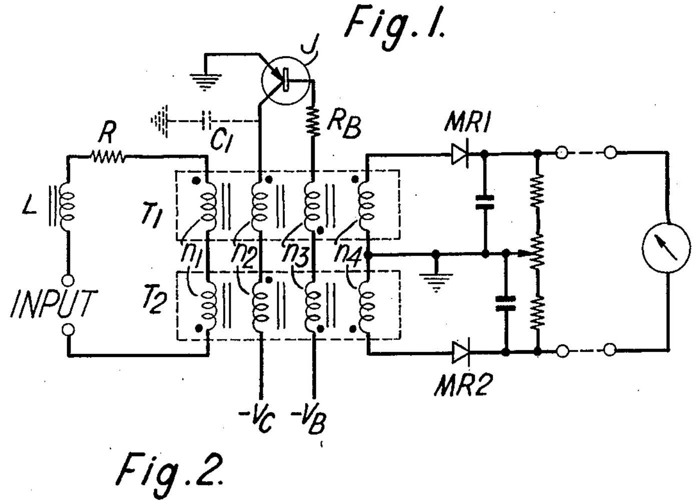
Figure 2:
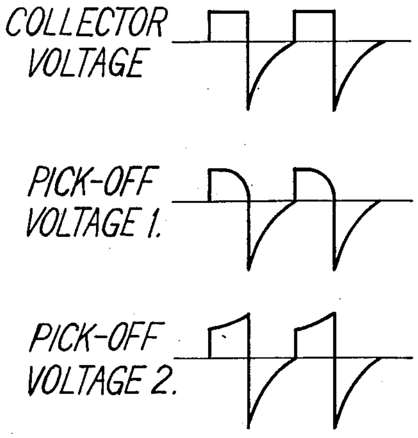
Figure 3:
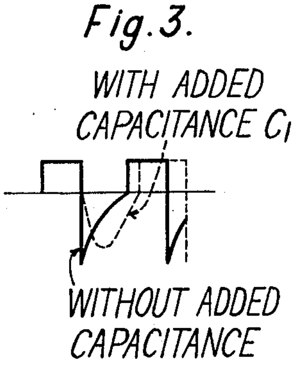
Figure 4:
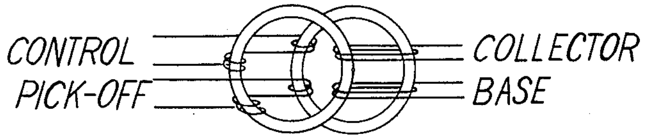

The accompanying diagrams illustrate the invention in detail. FIG. 1 is a circuit of the amplifier; FIGS. 2 and 3 are waveforms illustrating the operation of the circuit, and FIG. 4 illustrates a possible core structure and winding arrangement.

Referring to FIG. 1, T1 and T2 represent identical transductor magnetic cores each wound with four windings *n*1, *n*2, *n*3 and *n*4. Windings *n*2 and *n*3 are connected in series aiding fashion and are the coupled feedback windings connected to collector and base respectively of the grounded emitter transistor J and to current sources for operating it, the coil polarities being such that the arrangement forms a free-running blocking oscillator. The use of a transistor in this way can produce relatively large pulses of current from low voltage supply sources, since the transistor can be allowed to "bottom" in operation, and the cores are thereby driven into effective saturation if the number of turns and currents in them are designed accordingly.

The control windings *n*1 are connected in series opposition, as are also the output or pick-off windings *n*4. The junction of the two windings *n*4 is earthed and each pick-off winding feeds a separate rectifier, MR1 and MR2, and a separate reservoir condenser, the two rectified outputs being opposed so that their difference is the output from the amplifier. By rectifying the outputs from the pick-off coils in this way before opposing them to obtain their difference, the rectifiers MR1 and MR2, which may be silicon junction diodes or other metal rectifiers, are always driven well into the conducting region independently of the presence or absence of a signal and hence operate at high efficiency, which is not always attained with a single rectifier fed with the differential output only. With the independent rectifiers shown, the output/input characteristic is quite linear over a useful range of polarising currents.

In the absence of any polarising flux from an input signal the voltages induced in the two opposed pick-off windings *n*4 are equal and no output is obtained, but an input signal applied to the windings *n*1 produces a control current flux which aids the transistor collector current flux in one core and opposes it in the other. One core therefore saturates before the other, and as a result the voltages induced in the two pick-off windings *n*4 differ.

FIG. 2 illustrates the difference between the shape of the voltage waveforms at the transistor collector and at the pick-off windings *n*4.

It is important that the impedence connected across the control windings *n*1 should be high at the relevant frequencies, but for high sensitivity the D.C. resistance R in series with these windings should be low. These conflicting requirements are best met by connecting a low resistance choke L in series with the control windings. Optimum sensitivity is achieved when the input resistance is equal to the resistance of the source.

Although the above description mentions separate cores T1 and T2 each carrying its own set of windings, it is obviously possible to use common windings over the two cores, provided the correct winding sense is preserved, and the two cores shown can then be regarded as limbs of a common core and may be so in fact.

FIG. 3 shows the effect of adding a capacitance C1 from collector to earth. This is a useful means of keeping the reverse voltage swing at the collector within the limits specified for the particular transistor, without wasting power as occurs if a diode limiter is used.

Maximum sensitivity is obtained when the On/Off ratio is approximately unity and this condition can be procured by adjustment of $V_B$ and the transistor base resistor $R_B$.

The sensitivity can generally be increased by "tuning" the control and/or output windings, but care is required to avoid undesired resonances, e.g. with leakage inductances, which are necessarily high. Tuning may also degrade the linearity and tends to worsen the drift due to variations in any parameters which also effect the operating frequency.

Linearity may be improved by adding a further control winding and feeding back part of the rectified output to this winding. This may also be used to increase the input impedance, so that variations of input resistance, e.g. in the leads to a thermocouple, may be reduced.

Satisfactory performance has been obtained from ferrite pot cores and ferrite rings, but highest sensitivity seems to be given with mumetal or permalloy. The latter is very sensitive to ambient magnetic fields however, and unless a magnetic screen is used significant deflections are produced by changing the orientation of the amplifier in the earth's magnetic field. This property enables the device to be used as a magnetic field detector or meter.

The space occupied may be made very small by using small ferrite rings in an arrangement such as that shown in FIG. 4.

Pot cores are preferable if minimum sensitivity to ambient magnetic fields is desired, since these are largely self-screening.

In the amplifier above described the processes of amplification, waveform generation and modulation are combined in a manner which has a unique combination of advantages in that:

(*a*) The drift of transistor parameters with temperature, and small variations of supply voltage, produce only a second order effect on the output signal.

(*b*) Since only one transistor is involved, the reliability is improved, drift and unreliability due to a separate modulator being eliminated.

(*c*) The input impedance may be readily adjusted to suit the source impedance.

(*d*) A number of input signals, possibly at different impedance levels, can be easily added.

(*e*) Overall efficiency can be very high, due to the well known suitability of transistors for switching functions (i.e. current low when voltage high, voltage low when current high). Average power consumption can therefore be of the order of a few milliwatts, permitting operation from small batteries suitable for portable test equipment.

(*f*) The circuit lends itself readily to cascading of amplifier stages, so that any prescribed power gain can be achieved. Matching between stages is easy because of the property (*c*) above.

(*g*) By increasing the gain and using negative feedback, linearity can be improved to any extent necessary to make linearity commensurate with zero drift.

(*h*) Because of the simplicity of the circuit the number of possible sources of drift is small and in any particular application it should be an easy matter to determine which are important. This is a valuable feature in cases where the ultimate possible zero stability is required. The zero stability referred to the input achieved so far without special selection or matching of transistors or other components is of the order $10^{-11}$ watts over the temperature range 20–55° C. This is believed to be better than has been achieved in any other type of transistor D.C. amplifier so far reported.

(*j*) Although the device was primarily designed for amplification of low power direct current signals, such as those from thermocouples, strain gauges etc., or for stabilising the zero of transistor operational amplifiers, its bandwidth is limited only by the operating frequency.

What I claim is:

1. A stable-operating push-pull type D.C. or A.C. self-contained magnetic amplifier comprising magnetic transductor core means, a free-running oscillator having on said core means tightly coupled feedback windings for receiving supply signals to operate said oscillator and cause said core means to be magnetized towards saturation by oscillator signals, input signal windings on said core means arranged so an input signal to said input windings produces control flux which aids the magnetic flux produced by the oscillator signal flux in one part of the core means but opposes it in another part of the core means, and output windings disposed on said core means to produce differing output signals in response to the control flux aiding and opposing said oscillator signal flux.

2. An amplifier as in claim 1 and further including respective rectifying means for said output windings for rectifying said output signals, and means for opposing the rectified output signals against each other to obtain their difference.

3. An amplifier as in claim 1 wherein said oscillator is a blocking oscillator.

4. An amplifier as in claim 3 wherein the blocking element includes an active element, an input terminal and output terminal of which are respectively coupled to said feedback windings.

5. An amplifier as in claim 4 wherein said active element is a transistor and said input and output terminals thereof are respectively base and collector electrodes.

6. An amplifier as in claim 5 including a condenser connected between said collector electrode and a common potential point for limiting the reverse voltage swings of said collector electrode.

7. An amplifier as in claim 1 wherein said feedback windings comprise at least two oppositely wound windings for operating in said oscillator and on said core means as aforesaid, said input windings being in series opposition and said output windings being in series opposition.

8. An amplifier as in claim 1 and further including means for increasing both the input signal impedance and amplifier sensitivity.

9. An amplifier as in claim 1 wherein said input windings are in series opposition and in series with a choke.

10. An amplifier as in claim 1 wherein said core means includes two saturable cores each carrying four windings the first respective two of which are in series opposition and form said input windings, the second respective two of which are in series aiding relationship with the third respective two being in series aiding but in opposition respectively to said second two windings and tightly coupled thereto to form said feedback windings, the fourth respective two of said windings being in series opposition and forming said output windings, and a grounded emitter transistor having collector and base electrodes connected in series respectively to said second two and third two windings to form therewith a blocking oscillator as said free-running oscillator.

11. An amplifier as in claim 10 wherein said cores are respectively ferrite rings.

12. An amplifier as in claim 10 and further including respective rectifying means for said output windings for rectifying said output signals, and means for opposing the rectified output signals against each other to obtain their difference.

References Cited in the file of this patent

UNITED STATES PATENTS

| | | |
|---|---|---|
| 2,798,904 | Alexanderson | July 9, 1957 |
| 2,826,731 | Paynter | Mar. 11, 1958 |
| 2,953,741 | Pittman et al. | Sept. 20, 1960 |